US012804790B2

(12) United States Patent
Waiboer et al.

(10) Patent No.: US 12,804,790 B2
(45) Date of Patent: Nov. 17, 2026

(54) METROLOGY AND CONTROL SYSTEM

(71) Applicant: ASML Netherlands B.V., Veldhoven (NL)

(72) Inventors: Robert Rens Waiboer, Veldhoven (NL); Thijs Van De Camp, Waalre (NL); Willem Paul Beeker, Eindhoven (NL); Saartje Willemijn Van Der Hoeven, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 25 days.

(21) Appl. No.: 18/861,759

(22) PCT Filed: Jun. 13, 2023

(86) PCT No.: PCT/EP2023/065823

§ 371 (c)(1),
(2) Date: Oct. 30, 2024

(87) PCT Pub. No.: WO2024/012789

PCT Pub. Date: Jan. 18, 2024

(65) Prior Publication Data

US 2025/0306476 A1 Oct. 2, 2025

(30) Foreign Application Priority Data

Jul. 11, 2022 (EP) .................................... 22184227

(51) Int. Cl.

*G03F 7/20* (2006.01)
*G03F 7/00* (2006.01)
*H05G 2/00* (2006.01)

(52) U.S. Cl.

CPC ....... *H05G 2/0086* (2024.08); *G03F 7/70033* (2013.01); *G03F 7/7055* (2013.01);
(Continued)

(58) Field of Classification Search

CPC .... H05G 2/0086; H05G 2/0088; H05G 2/003; H05G 2/0082; H05G 2/0084;
(Continued)

(56) References Cited

U.S. PATENT DOCUMENTS 9,500,953 B2 11/2016 Yamamoto et al.
11,237,491 B2 2/2022 Hofstra et al.
(Continued)

OTHER PUBLICATIONS

Chiara Giovanardi, European International Searching Authority, International Search Report and Written Opinion, counterpart PCT Application No. PCT/EP2023/065823, mailed Jul. 14, 2023, 10 total pages.

*Primary Examiner* — Mesfin T Asfaw
(74) *Attorney, Agent, or Firm* — DiBerardino McGovern IP Group LLC

(57) ABSTRACT

A metrology and control system (100, 400, 500) for a laser beam in an EUV radiation source is disclosed. The system comprises an optical pickup (405, 540, 550) configured to measure a forward beam (410, 510, 520, 530) directed towards a target location (420, 535) and a return beam (415) reflected from the target location. The system also comprises actuatable optical devices (425, 430, 435, 465, 475, 555, 560, 565) configurable to direct and focus the forward beam onto the target location and align a measurement plane of the optical pickup with the target location. The actuatable optical devices are disposed before and after the optical pickup in a path of the forward beam, and the actuatable optical devices are controlled in response to a measurement of the forward beam and the return beam by the optical pickup.

18 Claims, 5 Drawing Sheets

(52) U.S. Cl.
CPC .... *G03F 7/70608* (2013.01); *G03F 7/706843* (2023.05); *H05G 2/0088* (2024.08)

(58) Field of Classification Search
CPC ............... G03F 7/70033; G03F 7/7055; G03F 7/70608; G03F 7/706843; G03F 7/7085
See application file for complete search history.

(56) References Cited

U.S. PATENT DOCUMENTS

| | | | | |
|---|---|---|---|---|
| 2015/0123018 | A1* | 5/2015 | Moriya | G01J 1/4257 250/504 R |
| 2018/0242441 | A1* | 8/2018 | Yanagida | G03F 7/70033 |
| 2019/0289707 | A1 | 9/2019 | Nishimura et al. | |
| 2021/0190583 | A1 | 6/2021 | Manger et al. | |

* cited by examiner

METROLOGY AND CONTROL SYSTEM

CROSS-REFERENCE TO RELATED APPLICATIONS

This application is the U.S. National Stage Application of International Patent Application No. PCT/EP2023/065823, filed on 13 Jun. 2023, which claims priority of EP Application Serial No. 22184227.1 which was filed on 11 Jul. 2022. Each of these applications is incorporated herein in its entirety by reference.

FIELD

The present invention relates to a metrology and control system for a laser beam in an EUV radiation source, and an associated method of controlling a laser in an EUV radiation source for an lithography apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

An EUV radiation source may generate the EUV radiation, wherein the EUV radiation source may be of a type which may be referred to as a laser produced plasma (LPP) source. In such an LPP source, a laser system may be arranged to deposit energy via one or more laser beams into a fuel at a plasma formation region. The deposition of laser energy into the fuel may create a plasma which emits EUV radiation.

In some examples, the laser system may be configured to provide one or more pre-pulse and/or vaporization pulse to the fuel to deform and rarefy the fuel respectively prior to a subsequent main pulse for producing the plasma. Such pre-pulses and vaporization pulses may provide a way to optimize a mass density and distribution of the fuel prior to interaction with the subsequent main pulse.

Metrology and control tools may be implemented to monitor and control the laser system, to ensure an efficient and optimized process of plasma production.

However, the position of the fuel at the plasma formation region may vary over time, increasing a complexity of maintaining a focus of the laser system directly on the fuel.

Furthermore, the metrology system may need to be adapted to accommodate a substantial range in measurements due to such variance in the fuel position. In some example, due to variation in the position of the fuel, a measurement plane of the metrology system may not match exactly a location where the laser system is focused onto the fuel.

It is therefore also desirable to provide a metrology and control solution suitable for use in an EUV radiation source and capable of accurately and precisely monitoring and controlling a focus of the one or more laser beams on the fuel at the plasma formation region.

It is therefore an aim of at least one embodiment of at least one aspect of the present disclosure to obviate or at least mitigate at least one of the above identified shortcomings of the prior art. Further examples of prior art are as follows.

SUMMARY

According to a first embodiment of the disclosure, there is provided a metrology and control system for a laser beam in an EUV radiation source. The system comprises an optical pickup configured to measure a forward beam directed towards a target location and a return beam reflected from the target location.

The system also comprises actuatable optical devices configurable to direct and focus the forward beam onto the target location and align a measurement plane of the optical pickup with the target location.

The actuatable optical devices are disposed before and after the optical pickup in a path of the forward beam, and the actuatable optical devices are controlled in response to a measurement of the forward beam and the return beam by the optical pickup.

Advantageously, the disclosed system, and in particular by implementation of actuatable optical devices both before and after the optical pickup, enables the target location to be maintained in a back-focal plane of focusing optics of the system, as described in more detail below.

That is, actuation before the optical pickup enables control of all significant beam properties, such as steering, direction, beam size/numerical aperture (NA) and beam curvature, into a focusing portion of the system, such that a focus of the beam ends up exactly in the back focal plane of the lens.

Actuation after the optical pickup ensure sure that the target location is positioned exactly in the back focal plane of the focusing optics, by means of measuring the return beam e.g. radiation reflected from fuel at the target location.

The actuatable optical devices may comprise at least one device for controlling a wavefront curvature of the forward beam and/or a diameter of the forward beam.

The at least one device may be disposed before the optical pickup in the path of the forward beam.

Advantageously, an actuatable optical device configured to control beam curvature and/or diameter before the optical pick up enables maintaining the target location in the back focal plane while at the same time maintaining the laser focused on the target location.

Each actuatable optical device may comprise at least one of: a deformable mirror; a position-controllable mirror; a position-controllable lens.

The measurement of the forward beam and the return beam by the optical pickup may comprise a measurement of the wavefront of the forward beam and the return beam. The measurement of the forward beam and the return beam by the optical pickup may comprise a measurement of the position of the forward beam and the return beam.

The optical pickup may comprise: a first sensor for measuring the forward beam; a second sensor for measuring the return beam; a beam-splitting device for directing a portion of the forward beam onto the first sensor; and a surface for directing the return beam onto the second sensor. The surface for directing the return beam onto the second sensor may be a reflective surface, e.g. a surface configured to reflect the return beam. The surface may be a surface of the beam-splitting device. The surface may be a surface of the beam-splitting device different from a further surface of the beam-splitting device upon which the forward beam is incident in use. That is, the surface may be a rear surface of the beam-splitting device.

The optical pickup may comprise a first focusing device for focusing the forward beam on the first sensor. The optical pickup may comprise a second focusing device for focusing the return beam on the second sensor. The first and second focusing devices may be configured to match an optical focal length of at least one of the actuatable optical devices for focusing the forward beam onto the target location.

That is, when the target location is exactly in the back focal plane—as is realized by the actuatable optical devices after the optical pickup—then both the first focusing device and the second focusing device may match a forward beam focal length, and therefore may determine a location of a focal point of the beam with respect to the target location.

Advantageously, by effectively matching the optical properties of the optical pickup to be equivalent to the focusing optics, the metrology and control system may correctly measure the forward beam properties that are particularly relevant to the focusing optics. This may minimizes the crosstalk of beam position errors of the forward beam on the laser to fuel target performance.

The actuatable optical devices may comprise a plurality of devices disposed after the optical pickup in the path of the forward beam and configurable to center the return beam on the second sensor.

Advantageously, by centering the beams on the sensors, the sensor ranges required may be minimized as the sensor are all operated close to the center of the range. Furthermore, the sensors may exhibit an improved linear response close to the center of the measurement range.

The metrology and control system may comprise actuatable position-controllable mirrors disposed before and after the optical pickup in the path of the forward beam, for steering the forward beam.

The metrology and control system may comprise a plurality of optical pickups, each optical pickup configured to measure one or more forward beams directed towards a respective target location and one or more respective return beams reflected from the respective target location. The metrology and control system may comprise actuatable optical devices configurable to direct and focus each forward beam onto the respective target location and align a measurement plane of the respective optical pickup with the respective target location. The actuatable optical devices may be disposed before and after each optical pickup in a path of each forward beam, and the actuatable optical devices may be controlled in response to a measurement of the one or more forward beams and each return beam by the respective optical pickup.

According to a second aspect of the disclosure, there is provided a radiation source for an EUV lithography apparatus, the radiation source comprising: the metrology and control system according to the first aspect; a fuel emitter for emitting fuel at the target location; and a laser configured to generate the forward beam to be reflected by the fuel as the return beam.

As described above, the fuel may be in liquid form and may, for example, be in the form of droplets emitted along a trajectory towards a plasma formation region. The trajectory of the droplets may vary slightly between droplets. Advantageously, the disclosed radiation source, and in particular the disclosed metrology and control system, effectively enables a position of the droplets, e.g. a target location for focusing the forward beam, to be tracked and thereby the position and focus of the forward beam can be adjusted accordingly to optimize plasma generation.

The radiation source may comprise a first laser configured for generating a pre-pulse forward beam for deforming the fuel, a second laser for generating a vaporization pulse forward beam for rarefying the fuel, and a third laser configured to generate a main pulse forward beam for generating an EUV-plasma from the fuel. The metrology and control system may be configured to direct and focus each forward beam onto the fuel at a/the target location and align a/the measurement plane with the respective target location.

According to a second aspect of the disclosure, there is provided a method of controlling a laser in a radiation source for an EUV lithography apparatus, the method comprising: configuring actuatable optical devices to direct and focus a forward beam of the laser onto a fuel at a target location and to align a measurement plane of an optical pickup with the target location, wherein the actuatable optical devices are disposed before and after the optical pickup in a path of the forward beam, and wherein actuation of the optical devices is controlled in response to a measurement, by the optical pickup, of the forward beam and a return beam reflected from the fuel at the target location.

The method may comprise a step of actuating at least one actuatable optical device to control a wavefront curvature of the forward beam and/or a diameter of the forward beam.

The forward beam comprises at least one of: a pre-pulse forward beam for deforming the fuel; a vaporization pulse forward beam for rarefying the fuel; and/or a main pulse forward beam for generating an EUV-plasma from the fuel.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE DRAWINGS

Embodiments of the invention will now be described, by way of example only, with reference to the accompanying schematic drawings, in which.

DETAILED DESCRIPTION

Figure 1:
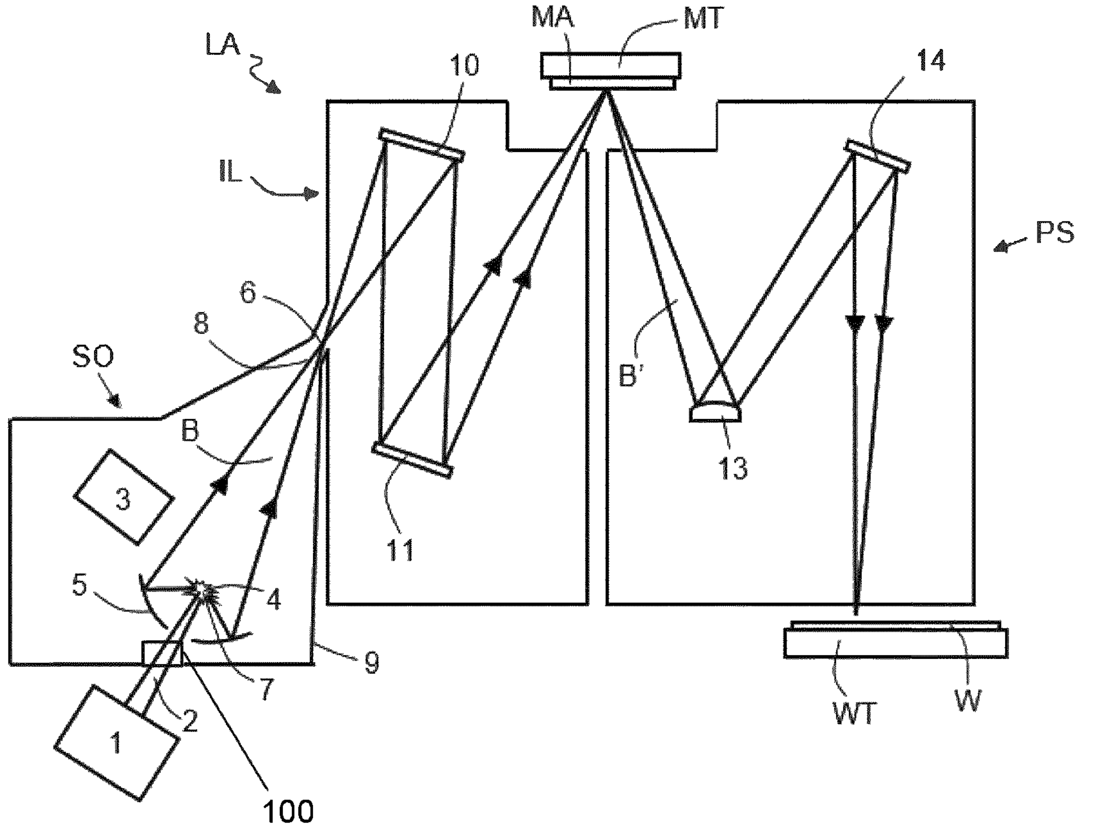
FIG. 1 depicts a lithographic system comprising a lithographic apparatus and a radiation source, and implementing a metrology and control system according to an embodiment of the disclosure.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a CO2 laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Also depicted in FIG. 1 is a metrology and control system 100 for analyzing a fuel, such as tin (Sn) which is provided from the fuel emitter 3 and for controlling the laser system 1 to deposit energy via the laser beam 2 into the fuel, as described in more detail below with reference to the example embodiments of FIGS. 4 and 5.

Figure 2:
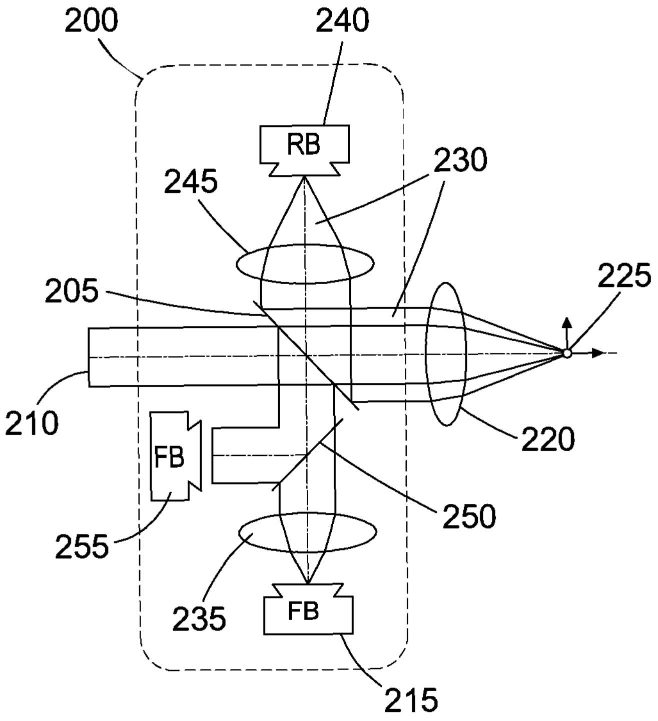
FIG. 2 depicts an example of an optical pickup in use in a prior art metrology system.

FIG. 2 depicts an example of an optical pickup 200 in use in a prior art metrology system. Also shown in FIG. 2 is an optical device 220 for focusing a forward beam 210 onto a target location 225, as described in more detail below.

The optical pickup 200 comprises a first beam-splitting device 205 for directing a portion of the forward beam 210 onto a first sensor 215, via a first focusing device 235 for focusing the forward beam 210 on the first sensor 215.

In the example of FIG. 2, the first focusing device 235 is represented as a convex lens, although it will be appreciated that in other examples the first focusing device 235 may comprise a plurality of lenses and/or optical elements.

The forward beam 210 may be a beam from a laser, such as a laser configured to provide a pre-pulse to a fuel at a target location 225.

The first sensor 215 may comprise a plurality of pixels, e.g. may be at least a quad-pixel design. As such, the first sensor 215 may be configurable to determine a relative position and/or size and/or intensity of an incident beam forward beam 210. For example, by comparing an intensity of radiation incident upon each pixel of the first sensor 215, a relative position and size of a focus of the forward beam 210 upon the first sensor 215 may be determined.

A further portion of the forward beam 210 continues through the beam-splitting device 205 towards an optical device 220 for focusing the forward beam 210 onto a target location 225.

In this example, the optical device 220 is represented as a convex lens, although it will be appreciated that in other examples the optical device 220 may comprise a plurality of lenses and/or optical elements.

In use, a fuel such as a droplet of tin, may be at the target location 225. At least a portion of the forward beam 210 may be reflected by the fuel at the target location 225 as a return beam 230.

The return beam 230 is collimated by the optical device 220, e.g. one or more lenses, and is then incident upon a reflective surface of the optical pickup 200. In the example of FIG. 2, the reflective surface is a surface of the first beam-splitting device 205, although in other examples the reflective surface may be implemented as a separate device.

The reflective surface reflects the return beam 230 towards onto a second sensor 240, via a second focusing device 245 for focusing the forward beam 210 on the first sensor 215.

In the example of FIG. 2, the second focusing device 245 is also represented as a convex lens, although it will be appreciated that in other examples the second focusing device 245 may comprise a plurality of lenses and/or optical elements.

The second sensor 240 may be substantially the same as the first sensor 215. That is, in examples the second sensor 240 may comprise a plurality of pixels, e.g. may be at least a quad-pixel design. As such, the second sensor 240 may be configurable to determine a relative position and/or size and/or intensity of an incident return beam 230. For example, by comparing an intensity of radiation of the return beam 230 incident upon each pixel of the first sensors, a relative position and size of a focus of the return beam 230 upon the second sensor 240 may be determined.

A second beam-splitter 250 is also provided in the path of the portion of the forward beam 210 directed towards the first sensor 215 by the first beam-splitting device 205. The second beam 250 splitter may direct a portion of the forward beam 210 onto a third sensor 255.

In use, a position of forward beam 210 on the first sensor 215, as measured by the first sensor 215, may be indicative of a focus position of the forward beam 210 at a primary focus, e.g. at the target location 225.

In use, a position of return beam 230 on the second sensor 240, as measured by the second sensor 240, may be indicative of a position of a fuel, e.g. a tin droplet, at the primary focus, e.g. the target location 225.

As such, if a position of the forward beam 210 measured by the first sensor 215 matches a position of the return beam 230 measured by the second sensor 240, then the forward beam 210 is focused on the fuel at the target location 225.

The third sensor 255 may give an indication of an x-y position of the forward beam 210.

In use, if the position of the forward beam 210 measured by the first sensor 215 does not match a position of the return beam 230 measured by the second sensor 240, then an actuatable optical device may be actuated to adjust the forward beam to align a focal point of the forward beam 210 with the fuel at the target location 225.

However, implementation of such an optical pickup 200 in a metrology system may be insufficient to measure and compensate for various degrees of freedom in the forward beam incident upon a fuel as the target location 225, particularly due to variations in the position of the target location 255 in use.

Figure 3:
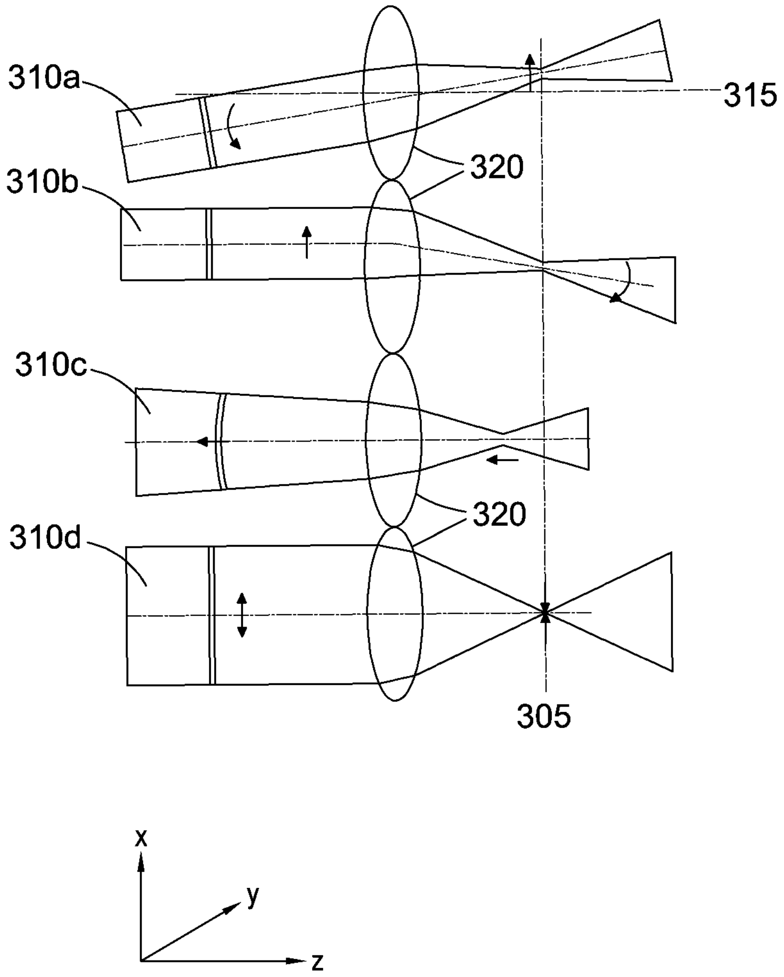
FIG. 3 depicts various examples of degrees of freedom in a forward beam.

Such degrees of freedom are illustrated in FIG. 3, which depicts various examples of degrees of freedom in a forward beam as directed though an optical device 320, equivalent to the optical device 220 of FIG. 2.

A plane 305 is depicted, which may be representative of a plane in which a target is to be located. The plane 305 is orthogonal to an optical axis 315 of an optical device 320.

In a first example, a forward beam 310*a* may be directed through the optical device 320. For purposes of example, the optical device 320 is represented as a convex lens, although it will be appreciated that in other examples the optical device 320 may comprise a one or more lenses and/or optical elements.

In the first example, the forward beam 310*a* is tilted in an x-y plane relative to the optical axis 315 of the optical device 320. As such, a focal point of the forward beam 310*a* due to the optical device 320 is offset from the plane 305, e.g. in a +x direction.

In the depicted example use case, such a tilt of the forward beam 310*a* in as it approaches the optical device 320 causes the forward beam 310*a* to be offset from the plane 305 in a +x direction. In use in a metrology and control system for a pre-pulse laser beam in an EUV radiation source, such an offset may cause a fuel target to be non-ideally deformed and/or oriented. For example, ideally a fuel droplet may be uniformly deformed to increase an available surface area for a subsequent vaporization and/or main pulse. However, such an offset in the pre-pulse incident upon the fuel may cause the fuel droplet to be non-uniformly deformed and/or oriented.

In a second example, a forward beam 310*b* may be directed through the optical device 320.

In the second example, the forward beam 310*b* is offset from the optical axis 315 of the optical device 320 in the x-y plane. In the specific example, forward beam 310*b* is offset in a +x direction. As such, a focal plane of the forward beam 310*b* due to the optical device 320 may be tilted relative to the plane 305.

In use in a metrology and control system for a pre-pulse laser beam in an EUV radiation source, such an offset in the focus of the forward beam 310*b* may cause a fuel target to be non-ideally deformed and/or oriented.

In a third example, a forward beam 310*c* may be directed through the optical device 320.

In the third example, a wavefront of the forward beam 310*c* is curved relative to the optical device 320. That is, the forward beam 310*c* is a non-ideally collimated forward beam 320*c*. As such, a focal point of the forward beam 310*c* due to the optical device 320 may be offset from the plane 305 in a −z direction.

In the depicted example use case, the curvature of the wavefront of the forward beam 310*c* causes a focal point of the forward beam 310*c* to be offset from a target location in a −z direction. In use in a metrology and control system for a pre-pulse laser beam in an EUV radiation source, such an offset of the focal point may cause a fuel target to be non-ideally deformed and/or oriented. In particular, such an offset may affect a size of the deformed fuel target.

Finally, in a fourth example a forward beam 310*d* may be directed through the optical device 320.

In the fourth example, a width, e.g. beam waist, equivalent to a numerical aperture, of the forward beam 310*d* is excessively large. Optical elements, such as the optical device 320, may generally exhibit poorer optical performance towards a periphery of an optical surface and better optical preface towards a center of the optical surface which is aligned with the optical axis 315. As such, an excessively wide forward beam 310*d* may also impact upon a depth of focus and/or beam waist at the plane 305, thereby resulting in a non-ideal deformation and/or orientation of a fuel target in use.

A metrology and control system for a laser beam in an EUV radiation source according to an embodiment of the disclosure may compensate for the above-described degrees of freedom in the forward beam 310*a-d*, as described below with reference to FIGS. 4 and 5.

Figure 4:
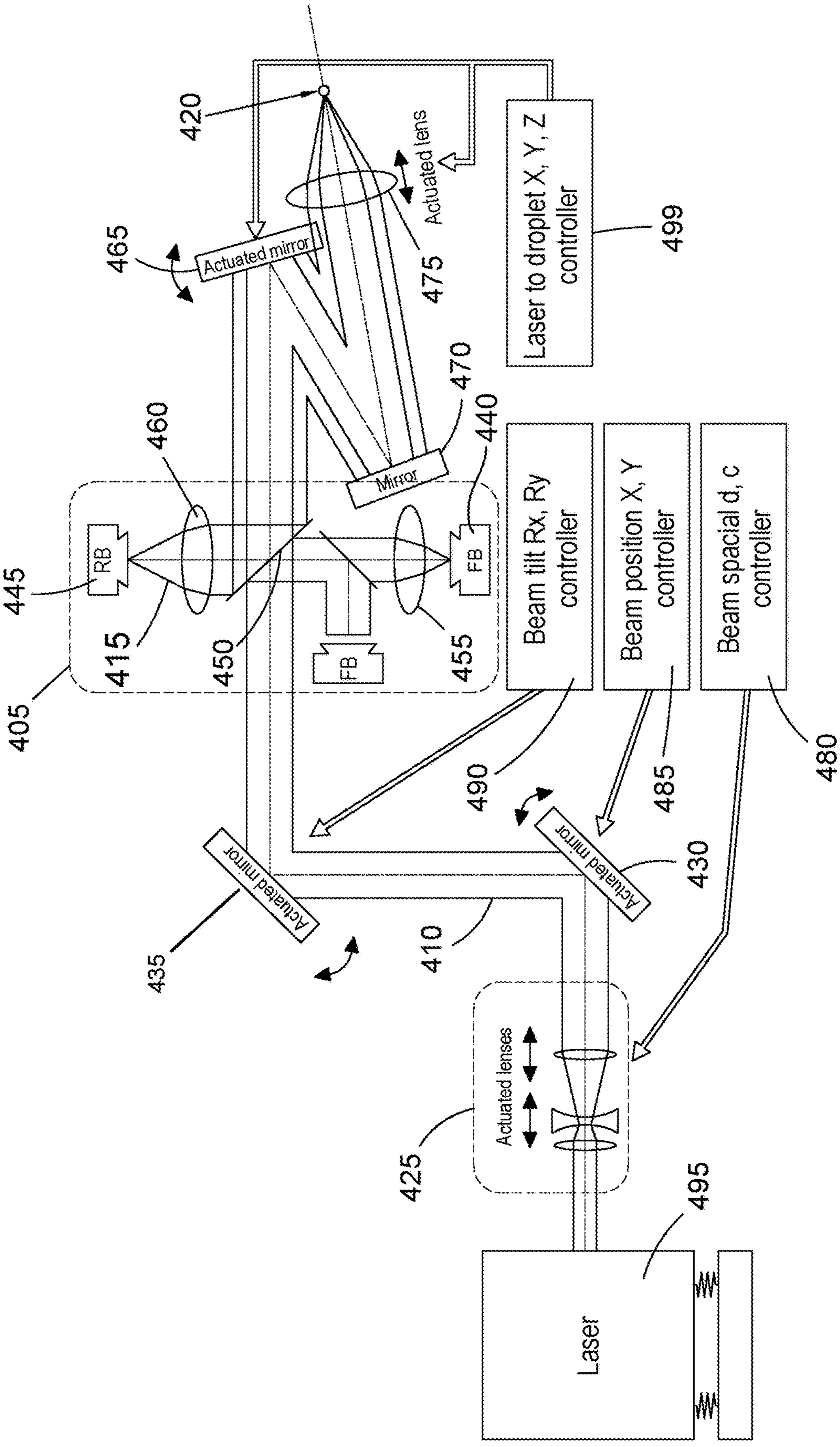
FIG. 4 depicts an example of a metrology and control system according to an embodiment of the disclosure.

FIG. 4 depicts an example of a metrology and control system 400 according to an embodiment of the disclosure. In examples, the metrology and control system 400 may be implemented as the metrology and control system 100 of FIG. 1.

The metrology and control system 400 comprises an optical pickup 405. The optical pickup 405 is configured to measure a forward beam 410 directed towards a target location 420 and a return beam 415 reflected from the target location 420.

The metrology and control system 400 comprises a plurality of actuatable optical devices 425, 430, 435, 465, 475 that are configurable to direct and focus the forward beam 410 onto the target location 420 and align a measurement plane of the optical pickup 405 with the target location 420, as described in more detail below. In particular, actuatable optical devices 425, 430, 435, 465, 475 are disposed both before and after the optical pickup 405 in a path of the forward beam 410, and the actuatable optical devices are controlled in response to a measurement of the forward beam 410 and the return beam 415 by the optical pickup 405.

The example metrology and control system 400 comprises a laser 495 configured to provide the forward beam 410. For purposes of non-limiting example only, the laser 495 is configured to provide a forward beam 410 suitable for use as a pre-pulse for optimizing a mass density and/or distribution of a fuel in an EUV radiation source, prior to interaction with a subsequent one or more vaporization and/or main pulses. It will be understood that the described example metrology and control system 400 may be suitable for use with the above-described vaporization pulse or main pulse. Furthermore, a metrology and control system embodying the disclosed invention may be suitable for use with more than one of the pre-pulse, vaporization pulse or main pulse, as described in more detail below with reference to the example metrology and control system 500 of FIG. 5.

The example metrology and control system 400 of FIG. 4 comprises a first actuatable optical device 425. The first actuatable optical device 425 is disposed before the optical pickup 405 in a path of the forward beam 410. The first actuatable optical device 425 is controlled by a first actuatable optical device controller 480.

The first actuatable optical device 425 is configurable for controlling a wavefront curvature of the forward beam 410. In examples, the first actuatable optical device 425 may additionally or alternatively configured to control a diameter of the forward beam 410.

As such the first actuatable optical device controller 480 is denoted "Beam-spatial d, c controller" in FIG. 4, wherein "d" refers to a width of the forward beam 410 and "c" refers to a curvature of a wavefront of the forward beam 410.

The first actuatable optical device 425 may comprise a plurality of devices, such as one or more lenses. A position and/or property of the first actuatable optical device 425 may be configurable, e.g. actuatable. That is, a position and/or property of one or more of the plurality of devices forming the first actuatable optical device 425 may be configurable.

In an example, the first actuatable optical device 425 may comprise one or more lenses, where a position of the one or more lenses may be adjusted. That is, the first actuatable optical device 425 may comprise one or more position-controllable lenses. An actuator, such as a servo motor, may be configurable to control a position of the one or more lenses.

In another example, the first actuatable optical device 425 may additionally or alternatively comprise one or more deformable lenses. In an example, optical properties of such a deformable lens may be adjusted by means for controlling a pressure in a fluid applied to one or more components of the deformable lens, such as an optical surface of the lens or a component for adjusting a tension in the lens.

In use, the first actuatable optical device 425 may be configured to compensate for a curvature of a wavefront of the forward beam 410, as described above with reference to the third example of a forward beam 310*c* directed towards the plane 305. That is, actuation of the first actuatable optical device 425 to control a curvature of a wavefront of the forward beam 410 may be controlled in response to a measurement of the forward beam 410 and the return beam 415 by the optical pickup 405.

Similarly, the first actuatable optical device 425 may be configured to adjust a width of the forward beam 310, e.g. reduce a numerical aperture as described above with reference to the fourth example of a forward beam 310*d* directed towards the plane 305. That is, actuation of the first actuatable optical device 425 to control a width of the forward beam 310 may be controlled in response to a measurement of the forward beam 410 and the return beam 415 by the optical pickup 405.

The example metrology and control system 400 comprises a second actuatable optical device 430. The second actuatable optical device 430 is disposed before the optical pickup 405 in a path of the forward beam 410. The second actuatable optical device 430 is disposed after the first actuatable optical device 425 in the path of the forward beam 410. The second actuatable optical device 430 is controlled by a second actuatable optical device controller 485.

The second actuatable optical device 430 is a mirror, e.g. a reflective surface suitable for reflecting radiation having a wavelength of the forward beam 410.

In the examples, the second actuatable optical device 430 is a position-controllable mirror. That is, a tilt of the second actuatable optical device 430 may be adjusted by an actuator, such as a servo motor or the like.

In other examples, the second actuatable optical device 430 may comprise a deformable mirror. Optical properties of such a deformable mirror may be adjusted by means for controlling a pressure in a fluid applied to one or more components of the deformable mirror, such as a rear surface of the deformable mirror.

In use, the second actuatable optical device 430 may be configured to compensate for an offset in the forward beam 410 relative to an optical axis of the second actuatable optical device 430, as described above with reference to the second example of a forward beam 310*b* directed towards the plane 305. That is, actuation of the second actuatable optical device 430 to control an offset of the forward beam 410 may be controlled in response to a measurement of the forward beam 410 and the return beam 415 by the optical pickup 405, wherein a measurement of the forward beam 410 and the return beam 415 by the optical pickup 405 may comprise a measurement of the wavefront and/or position of the forward beam 410 and the return beam 415.

As such the second actuatable optical device controller 485 is denoted "Beam position X-Y controller" in FIG. 4, wherein the controller 185 configures the second actuatable optical device 430 to adjust a position of the forward beam 410 in the X-Y plane (as denoted in FIG. 3) to compensate for the offset in the forward beam 410

The example metrology and control system 400 comprises a third actuatable optical device 435. The third actuatable optical device 435 is disposed before the optical pickup 405 in a path of the forward beam 410. The third actuatable optical device 435 is controlled by a third actuatable optical device controller 490.

The third actuatable optical device 435 is a mirror for reflecting the forward beam 410. In the examples, the third actuatable optical device 435 is a position-controllable mirror. That is, a tilt of the third actuatable optical device 435 may be adjusted by an actuator, such as a servo motor or the like. In other examples, the third actuatable optical device 435 may comprise a deformable mirror.

In use, the third actuatable optical device 435 may be configured to compensate for a tilt in the forward beam 410 relative to an optical axis, as described above with reference to the first example of a forward beam 310*a* directed towards the plane 305. Actuation of the third actuatable optical device 435 to compensate for the effects of a tilt in the forward beam 410 may be controlled in response to a measurement of the forward beam 410 and the return beam 415 by the optical pickup 405.

As such, the second actuatable optical device 430 and the third actuatable optical device 435 may effectively be used for steering the forward beam 410.

The third actuatable optical device controller 490 is denoted "Beam tilt Rx, Ry controller" in FIG. 4, wherein the third actuatable optical device controller 490 configures the third actuatable optical device 435 to compensate for a tilt in the forward beam 410.

Although only three actuatable devices 425, 430, 435 are depicted before the optical pickup 405 in the path of the forward beam 410, it will be appreciated that this is for purposes of example only, and in other examples falling within the scope of the disclosure one or more further actuatable devices may be implemented before the optical pickup 405 in the path of the forward beam 410 for controlling a tilt and/or position and/or width and/or curvature of the forward beam 410.

The optical pickup 405 comprises a first sensor 440 for measuring the forward beam 410, a second sensor 445 for measuring the return beam 415, a beam-splitting device 450 for directing a portion of the forward beam 410 onto the first sensor 440, and a reflective surface for directing the return beam 415 onto the second sensor 445. The optical pickup 405 also comprises a first focusing device 455 for focusing the forward beam 410 on the first sensor 440 and a second focusing device 460 for focusing the return beam 415 on the second sensor 455.

The first sensor 440, second sensor 445, beam-splitting device 450, reflective surface, first focusing device 455 and second focusing device 460 generally correspond to the first sensor 215, second sensor 240, beam-splitting device 205, reflective surface, first focusing device 235 and second focusing device 245 of the pickup 200 of FIG. 2, and therefore are not described in further detail for purposes of brevity.

The example metrology and control system 400 also comprises a fourth actuatable optical device 465. The fourth actuatable optical device 465 is disposed after the optical pickup 405 in the path of the forward beam 410. The fourth actuatable optical device 465 is disposed in the path of the return beam 415.

The fourth actuatable optical device 465 is a mirror for reflecting the forward beam 410, and the return beam 415. In the examples, the fourth actuatable optical device 465 is a position-controllable mirror. That is, a tilt of the fourth actuatable optical device 465 may be adjusted by an actuator, such as a servo motor or the like. In other examples, the fourth actuatable optical device 465 may comprise a deformable mirror.

As such, the fourth actuatable optical device 465 together with the second actuatable optical device 430 and the third actuatable optical device 435 may effectively be used for steering the forward beam 410.

Furthermore, the fourth actuatable optical device 465 is configurable to center the return beam 415 on the second sensor 445 of the optical pickup 405. By centering the return beam 415 on the second sensor 445, a range required by the second sensor 445 may be minimized, and the second sensor 445 may be operated close to the center of an available range, and within a region of the sensor exhibiting a relatively high linear response.

A further optical device 470 in the path of the forward beam 410 and return beam 415 is also depicted, wherein for purposes of example the further optical device 470 is a mirror. In other examples, the further optical device 470 may be an actuatable optical device 470.

The example metrology and control system 400 also comprises a fifth actuatable optical device 475. The fifth actuatable optical device 475 is disposed after the optical pickup 405 in the path of the forward beam 410. The fifth actuatable optical device 475 is disposed in the path of the return beam 415.

Although only two actuatable devices 465, 475 are depicted after the optical pickup 405 in the path of the forward beam 410 and the return beam 415, it will be appreciated that this is for purposes of example only, and in other examples falling within the scope of the disclosure one or more further actuatable devices may be implemented after the optical pickup 405 in the path of the forward beam 410 for controlling a tilt and/or position and/or width and/or curvature of the forward beam 410 upon the target location 420 and for directing the return beam towards the second sensor 445 and centering the return beam on the second sensor 445.

The fifth actuatable optical device 475 is disposed after the optical pickup 405 in the path of the forward beam 410 and the return beam 415. In the example, the fifth actuatable optical device 475 is disposed after the fourth actuatable optical device 465 in the in the path of the forward beam 410.

The example fifth actuatable optical device 475 comprises an actuatable lens. In use, the fifth actuatable optical device 475 may be actuated to focus the forward beam 410 on a fuel at the target location 410, thereby also ensuring the measurement plane of the optical pickup 405 is aligned with the target location 410.

Furthermore, an optical focal length of the fifth actuatable optical device 475 is configured to match that of the first focusing device 455 and the second focusing device 460 of the optical pickup 405. As such, by actuating the fifth actuatable optical device 475 to focus the forward beam 410 on the fuel at the target location 410, e.g. ensuring the target location 410 is exactly in the back focal plane, then both the first focusing device 455 and the second focusing device 460, which match the forward beam 410 focal length, may provide an indication that a location of a focal point of the forward beam 410 is exactly at the target location 420.

The fourth and fifth actuatable optical devices 465, 475 are controlled by a fourth actuatable optical device controller 499. The fourth actuatable optical device controller 499 is denoted "Laser to droplet X,Y,Z controller" in FIG. 4, because the fourth controller 499 may actuate the fourth and fifth actuatable optical devices 465, 475 to control steering and positioning of a focal point of the forward beam 410 in the x, y and z directions, as denoted in FIG. 3.

That is, the fourth and fifth actuatable optical devices 465, 475 may control the position of a focal point of the forward beam 410 in the x, y and z directions to ensure the forward beam 410 is precisely incident upon a fuel at the target location to optimize an EUV plasma generation process in an EUV radiation source. By controlling the focal point of the forward beam 410 as such, the fourth and fifth actuatable optical devices 465, 475 also ensure that the return beam 415 reflected by the fuel at the target location 420 may be directed towards a center of the second sensor 445.

Figure 5:
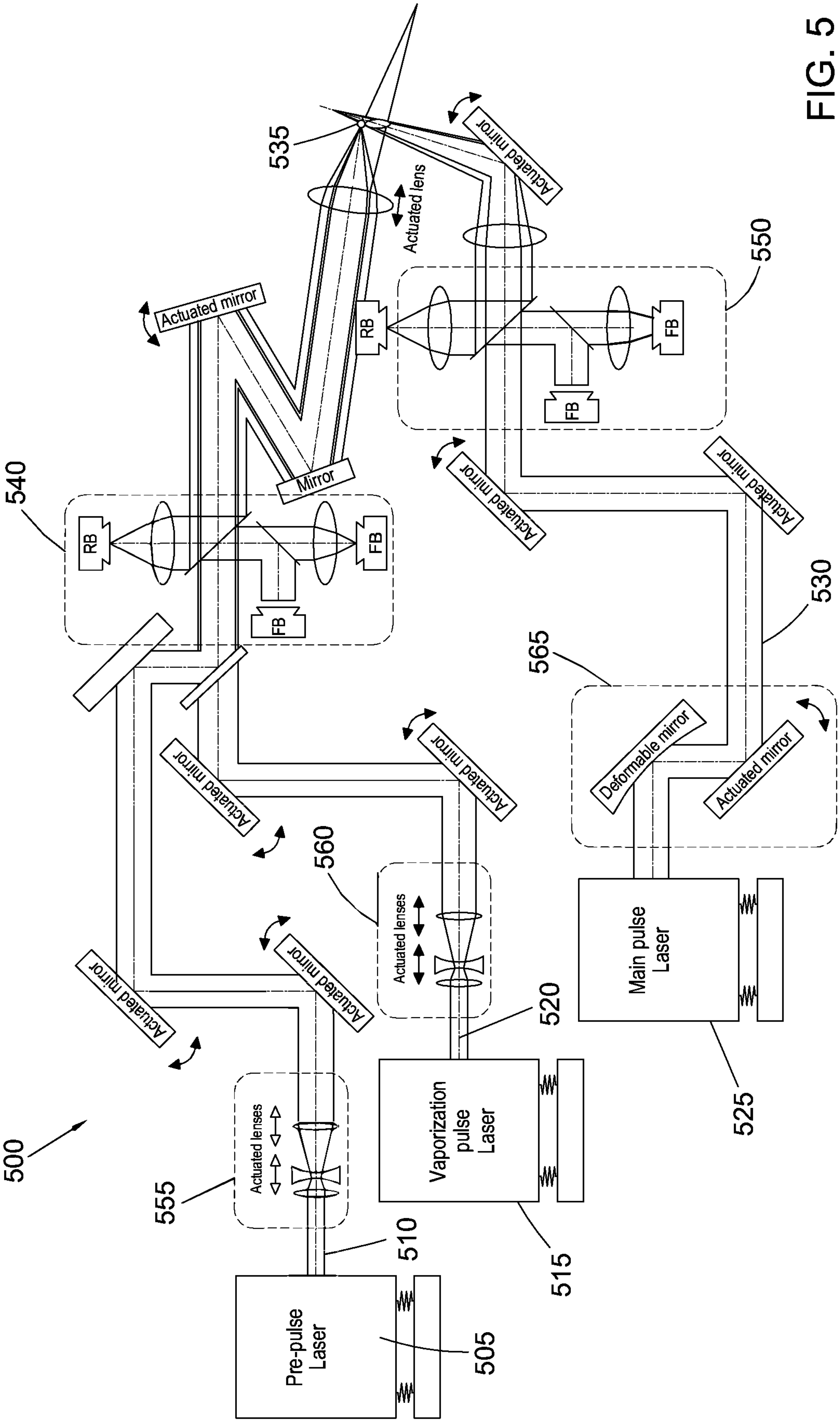
FIG. 5 depicts an example of a metrology and control system according to a further embodiment of the disclosure.

FIG. 5 depicts an example of a metrology and control system 500 according to a further embodiment of the disclosure. FIG. 5 is included to provide an example of the metrology and control system 400 of FIG. 4 applied to a plurality of laser beams in an EUV radiation source. In examples, the metrology and control system 500 may be implemented as the metrology and control system 100 of FIG. 1.

The example metrology and control 500 system comprises a first laser 505 configured for generating a pre-pulse forward beam 510 for deforming the fuel, a second laser 515 for generating a vaporization pulse forward beam 520 for rarefying the fuel, and a third laser 525 configured to generate a main pulse forward beam 530 for generating an EUV-plasma from the fuel.

The metrology and control system 500 is configured to direct and focus each forward beam 510, 520, 530 onto the fuel at a target location 535 and align a measurement plane with the target location 535.

It will be appreciated that, in use, the pre-pulse forward beam 510, vaporization pulse forward beam 520 and main pulse forward beam 530 may be provided in sequence, with each beam comprising one or more pulses.

In use, each forward beam 510, 520, 530 is directed toward a dynamic fuel target that may be in motion. As such, it will be understood that target location 535 may vary, e.g. the target location 535 each of the forward beams 510, 520, 530 may be different.

A first optical pickup 540 is configured to measure the pre-pulse forward beam 510 directed towards a fuel droplet at a target location 535 and a pre-pulse return beam reflected from the target location 535.

The first optical pickup 540 is also configured to subsequently measure the vaporization pulse forward beam 520 directed towards the fuel droplet at the target location 535 and a vaporization pulse return beam reflected from the target location 535.

A second optical pickup 550 is configured to measure the main pulse forward beam 530 directed towards a fuel droplet at the target location 535 and a main pulse return beam reflected from the target location 535.

A plurality of actuatable optical devices are depicted, wherein the actuatable optical devices are configurable to direct and focus each forward beam 510, 520, 530 onto the respective target location 535 and align a measurement plane of the respective optical pickup 540, 550 with the respective target location 535.

As described above with reference to the example system of FIG. 4, the plurality of actuatable optical devices may comprise, for example, one or more deformable mirrors, position-controllable mirrors and/or position-controllable lenses.

The actuatable optical devices are disposed before and after the first and second optical pickups 540, 550 in a path of each respective forward beam 510, 520, 530, and the actuatable optical devices are controlled in response to one or more measurements of each of the forward beams 510, 520, 530 and each return beam by the respective optical pickup 540, 550, as described above with reference to the example metrology and control system 400 of FIG. 4.

In particular, a first actuatable device 555, which may comprise one or more actuatable optical elements, is provided for controlling a wavefront curvature of the pre-pulse forward beam 510 and/or a diameter of the pre-pulse forward beam 510, wherein the first actuatable device 555 is disposed before the first optical pickup 540 in the path of the pre-pulse forward beam 510. Also, a second actuatable device 560, which may comprise one or more actuatable optical elements, is provided for controlling a wavefront curvature of the vaporization pulse forward beam 520 and/or a diameter of the vaporization pulse forward beam 520, wherein the second actuatable device 560 is disposed before the first optical pickup 540 in the path of the vaporization pulse forward beam 510. Also, one or more third actuatable devices 565, which may each comprise one or more actuatable optical elements, is provided for controlling a wavefront curvature of the main pulse forward beam 530 and/or a diameter of the main pulse forward beam 530, wherein the one or more third actuatable devices 565 are disposed before the second optical pickup 545 in the path of the main pulse forward beam 510.

As described above with reference to FIG. 4, various further actuatable optical devices are provided to control a tilt and position for each forward beam 510, 520, 530.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A metrology and control system for a laser beam in an EUV radiation source, the metrology and control system comprising:

- an optical pickup comprising: first optics configured to measure a forward beam, provided by a laser, directed towards a target location; and second optics configured to measure a return beam reflected from the target location; and
- actuatable optical devices configurable to direct and focus the forward beam onto the target location and align a measurement plane of the optical pickup with the target location, the actuatable optical devices comprise at least a first actuatable optical device disposed in a path of the forward beam between the laser and the optical pickup, the first actuatable optical device configured to control a wavefront curvature of the forward beam and/or a diameter of the forward beam;
- wherein the actuatable optical devices are disposed before and after the optical pickup in a path of the forward beam, and the actuatable optical devices are controlled in response to a measurement of the forward beam by the first optics and a measurement of the return beam by the second optics of the optical pickup.

2. The metrology and control system of claim 1, wherein each actuatable optical device comprises at least one of:

- a deformable mirror;
- a position-controllable mirror; and
- a position-controllable lens.

3. The metrology and control system of claim 1, wherein the measurement of the forward beam and the return beam by the optical pickup comprises a measurement of the wavefront and/or position of the forward beam and the return beam.

4. The metrology and control system of claim 1, wherein:

- the first optics comprise a first sensor configured to measure the forward beam;
- the second optics comprise a second sensor configured to measure the return beam; and
- the optical pickup further comprises a beam-splitting device configured to direct a portion of the forward beam onto the first sensor and a surface configured to direct the return beam onto the second sensor.

5. The metrology and control system of claim 4, wherein the first optics comprise a first focusing device configured to focus the forward beam on the first sensor and the second optics comprise a second focusing device configured to focus the return beam on the second sensor, and wherein the first and second focusing devices are configured to match an optical focal length of at least one of the actuatable optical devices for focusing the forward beam onto the target location.

6. The metrology and control system of claim 4, wherein the actuatable optical devices comprise a plurality of devices disposed after the optical pickup in the path of the forward beam and configurable to center the return beam on the second sensor.

7. The metrology and control system of claim 1, wherein the actuatable optical devices comprise actuatable position-controllable mirrors disposed before and after the optical pickup in the path of the forward beam for steering the forward beam.

8. The metrology and control system of claim 7, wherein the actuatable position-controllable mirrors comprise two mirrors disposed before the optical pickup and one mirror disposed after the optical pickup.

9. The metrology and control system of claim 1, further comprising:

- a plurality of optical pickups, each optical pickup configured to measure one or more forward beams directed towards a respective target location and one or more respective return beams reflected from the respective target location; and
- actuatable optical devices configurable to direct and focus each forward beam onto the respective target location and align a measurement plane of the respective optical pickup with the respective target location,
- wherein the actuatable optical devices are disposed before and after each optical pickup in a path of each forward beam, and the actuatable optical devices are controlled in response to a measurement of the one or more forward beams and each return beam by the respective optical pickup.

10. The metrology and control system of claim 1, wherein a plurality of actuatable optical devices are disposed before the optical pickup and a plurality of actuatable optical devices are disposed after the optical pickup.

11. The metrology and control system of claim 1, wherein the actuatable optical devices comprise an actuatable lens configured to focus the forward beam onto the target location.

12. A radiation source (SO) for an EUV lithography apparatus (LA), the radiation source comprising:

- a fuel emitter configured to emit fuel at a target location;
- a laser configured to generate a forward beam towards the target location; and
- a metrology and control system comprising:
  - an optical pickup comprising: first optics configured to measure the forward beam directed towards the target location and second optics configured to measure a return beam reflected from the target location; and
  - actuatable optical devices configurable to direct and focus the forward beam onto the target location and align a measurement plane of the optical pickup with the target location, the actuatable optical devices comprise at least a first actuatable optical device disposed in a path of the forward beam between the laser and the optical pickup, the first actuatable optical device configured to control a wavefront curvature of the forward beam and/or a diameter of the forward beam;
  - wherein the actuatable optical devices are disposed before and after the optical pickup in a path of the forward beam, and the actuatable optical devices are controlled in response to a measurement of the forward beam by the first optics and the return beam by the second optics of the optical pickup.

13. The radiation source (SO) of claim 12, further comprising:

a first laser configured to generate a pre-pulse forward beam for deforming the fuel, a second laser configured to generate a vaporization pulse forward beam for rarefying the fuel, and a third laser configured to generate a main pulse forward beam for generating an EUV-plasma from the fuel, and wherein the metrology and control system is configured to direct and focus each forward beam onto the fuel at the target location and align the measurement plane with the respective target location.

14. A method of controlling a laser in a radiation source (SO) for an EUV lithography apparatus (LA), the method comprising:

configuring actuatable optical devices to direct and focus a forward beam of the laser onto a fuel at a target location and to align a measurement plane of an optical pickup with the target location, wherein the forward beam comprises at least one of: a pre-pulse forward beam configured to deform the fuel; a vaporization pulse forward beam configured to rarefy the fuel; and a main pulse forward beam configured to generate an EUV-plasma from the fuel, wherein the actuatable optical devices are disposed before and after the optical pickup in a path of the forward beam, and wherein actuation of the optical devices is controlled in response to a measurement, by the optical pickup, of the forward beam and a return beam reflected from the fuel at the target location.

15. The method of claim 14, further comprising actuating at least one actuatable optical device to control a wavefront curvature of the forward beam and/or a diameter of the forward beam.

16. A metrology and control system for a laser beam in an EUV radiation source, the metrology and control system comprising:

an optical pickup configured to measure: a forward beam, provided by a laser, directed towards a target location and a return beam reflected from the target location;

a first actuatable optical device disposed in a path of the forward beam between the laser and the optical pickup, the first actuatable optical device configured to control one or more of a wavefront curvature and a diameter of the forward beam;

a second actuatable optical device disposed in a path of the forward beam between the laser and the optical pickup, the second actuatable optical device configured to compensate for an offset in the forward beam in a transverse plane at the target location;

a third actuatable optical device disposed in a path of the forward beam between the laser and the optical pickup, the third actuatable optical device configured to compensate for a tilt in the forward beam; and a set of focal actuatable optical devices disposed in a path of the forward beam between the optical pickup and the target location, the set of focal actuatable optical devices configured to control steering and positioning of a focal point of the forward beam at the target location.

17. The metrology and control system of claim 16, wherein the combination of the second actuatable optical device, the third actuatable optical device and the set of focal actuatable optical devices is configured to steer the forward beam.

18. The metrology and control system of claim 16, wherein the set of focal actuatable optical devices is configured to center the return beam on a return beam sensor of the optical pickup.

* * * * *